United States Patent
Do et al.

(10) Patent No.: US 8,384,147 B2
(45) Date of Patent: Feb. 26, 2013

(54) HIGH ENDURANCE NON-VOLATILE MEMORY CELL AND ARRAY

(75) Inventors: Nhan Do, Saratoga, CA (US); Amitay Levi, Cupertino, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 25 days.

(21) Appl. No.: 13/097,766

(22) Filed: Apr. 29, 2011

(65) Prior Publication Data
US 2012/0273864 A1 Nov. 1, 2012

(51) Int. Cl.
*H01L 29/792* (2006.01)
*H01L 29/788* (2006.01)
*G11C 7/00* (2006.01)

(52) U.S. Cl. .................. 257/315; 257/321; 365/185.1
(58) Field of Classification Search .................. None
See application file for complete search history.

(56) References Cited

U.S. PATENT DOCUMENTS

| | | | | |
|---|---|---|---|---|
| 4,794,565 A * | 12/1988 | Wu et al. | .................. | 365/185.15 |
| 5,029,130 A | 7/1991 | Yeh | | |
| 6,747,310 B2 * | 6/2004 | Fan et al. | ..................... | 257/320 |
| 7,057,931 B2 * | 6/2006 | Lutze et al. | ............. | 365/185.18 |
| 7,075,140 B2 * | 7/2006 | Spadea | ......................... | 257/315 |
| 7,358,134 B2 * | 4/2008 | Wu et al. | ........................ | 438/257 |
| 7,710,763 B2 * | 5/2010 | Houston | ........................ | 365/154 |
| 7,718,488 B2 * | 5/2010 | Chen et al. | ..................... | 438/257 |
| 7,906,805 B2 * | 3/2011 | Sadd et al. | ..................... | 257/316 |
| 2005/0281125 A1 * | 12/2005 | Chung | ......................... | 365/232 |
| 2006/0145192 A1 * | 7/2006 | Van Duuren et al. | ......... | 257/202 |
| 2007/0158737 A1 * | 7/2007 | Yang et al. | .................... | 257/315 |
| 2007/0218632 A1 * | 9/2007 | Chung | ......................... | 438/264 |
| 2007/0257299 A1 * | 11/2007 | Chen et al. | .................... | 257/315 |
| 2009/0039410 A1 * | 2/2009 | Liu et al. | ....................... | 257/320 |

OTHER PUBLICATIONS

PCT International Search Report of PCT/US12/27788; dated Jul. 18, 2012.
PCT Written Opinion of PCT/US12/27788; dated Jul. 18, 2012.

* cited by examiner

*Primary Examiner* — Thomas L Dickey
*Assistant Examiner* — Joseph Schoenholtz
(74) *Attorney, Agent, or Firm* — DLA Piper LLP (US)

(57) ABSTRACT

Systems of electrically programmable and erasable memory cell are disclosed. In one exemplary implementation, a cell may have two storage transistors in a substrate of semiconductor material of a first cooductivity type The first storage transistor is of the type having a first region and a second region each of a second conductivity type in the substrate The second storage transistor is of the type having a third region and a fourth region each of a second conductivity type in the substrate. Arrays formed of such memory cells and non-volatile memory cells are also disclosed.

17 Claims, 3 Drawing Sheets

HIGH ENDURANCE NON-VOLATILE MEMORY CELL AND ARRAY

TECHNICAL FIELD

The present invention relates to a non-volatile memory cell in which program and read are conducted on separate leads to the memory cell to produce a high endurance memory cell. The present invention also relates to an array of such memory cells.

BACKGROUND OF THE INVENTION

Non-volatile memory storage transistors are well known in the art. In particular a non-volatile memory storage transistors using a floating gate to store charges thereon which control the conduction of the channel region over which the floating gate is positioned is well known in the art. Referring to FIG. 1 there is shown a cross-sectional view of a non-volatile memory storage transistor 10 of the prior art. Such a storage transistor 10 is fully disclosed in U.S. Pat. No. 5,029,130 whose disclosure is incorporated in its entirety.

The storage transistor 10 comprises a substrate 12 of a first conductivity type, such as P type. A first region 14 and a second region 16 each of a second conductivity type is in the substrate 12 spaced apart from one another by a channel region 18. A floating gate 22 is over a portion of the channel region 18 and is insulated therefrom by an insulator. The floating gate 22 is also over a portion of the first region 14 and is capacitively coupled thereto, as disclosed in U.S. Pat. No. 5,029,130. A control gate 29 is adjacent to the floating gate 22, spaced apart therefrom, and controls the conduction of current in another portion of the channel region 18. The control gate 29 is capacitively coupled to the floating gate 22. In the operation of the storage transistor 10, during programming, a first current (or programming current) is applied to the second region 16, while during a read operation, a first voltage (read voltage) is applied to the second region 16. However, during programming, electrons from the second region 16 travel to the first region 14, and are injected onto the floating gate 22. Some electrons may be trapped at the insulator interface between the floating gate 22 and the substrate 12. Over time, this degrades the floating gate transistor transconductance and degrades the endurance of the storage transistor 10.

Referring to FIG. 2 there is shown a schematic view of an array of storage transistors 10. Referring to FIG. 3 there is shown a top view of an array of the storage transistors 10 of the prior art.

Referring to FIG. 4, there is shown a cross sectional view of another storage transistor 50 of the prior art. The storage transistor 50 is fully disclosed in U.S. Pat. No. 6,747,310 whose disclosure is incorporated herein in its entirety by reference. The storage transistor 50 is similar to the storage transistor 10. The storage transistor 50 comprises a substrate 12 of a first conductivity type, such as P type. A first region 34 and a second region 36 each of a second conductivity type is in the substrate 12 spaced apart from one another by a channel region 39. A floating gate 31 is over a portion of the channel region 39 and is insulated therefrom. A select gate 33 is adjacent to the floating gate 31, spaced apart therefrom, and controls the conduction of current in another portion of the channel region 39. The select gate 33 is capacitively coupled to the floating gate 31. In addition, a control gate 32 is on top of the floating gate 31. Finally, an erase gate 35 is over the first region 34, and is adjacent to the floating gate 31 on a side opposite to the select gate 33. Similar to the operation of the storage transistor 10 in the operation of the storage transistor 50, during programming, a first current (or programming current) is applied to the second region 36, while during a read operation, a first voltage (read voltage), is applied to the second region 36. Similar to the storage transistor 10, during programming, program disturbance may degrade the endurance of the storage transistor 50.

Hence it is one object of the present invention to reduce the affect of programming disturbance on the endurance of a non-volatile storage transistor.

SUMMARY OF THE INVENTION

Accordingly, in the present invention, an electrically programmable and erasable memory cell has two storage transistors in a substrate of semiconductor material of a first conductivity type. The first storage transistor is of the type having a first region and a second region each of a second conductivity type in the substrate. The first and second regions are spaced apart from one another with a first channel region therebetween, which is defined in a first direction. A first floating gate is over at least a portion of the first channel region, is insulated therefrom, to control the conduction of current through the first channel region. A first control gate is capacitively coupled to the first floating gate. The first storage transistor is read by applying a first voltage to the first region. The second storage transistor is of the type having a third region and a fourth region each of a second conductivity type in the substrate. The third and fourth regions are spaced apart from one another with a second channel region therebetween, defined in the first direction. The second storage transistor is adjacent and spaced apart from the first storage transistor in a second direction substantially perpendicular to the first direction, with the third region laterally spaced apart from the first region in the second direction and the fourth region laterally spaced apart from the second region in the second direction. The second storage transistor further comprises a second floating gate over at least a portion of the second channel region, insulated therefrom, to control the conduction of current through the second channel region. A second control gate is capacitively coupled to the second floating gate. The second storage transistor is programmed by applying a first current to said third region. The first floating gate is electrically connected to the second floating gate. The first region is insulated from the third region in the substrate. The memory cell is programmed by applying the first current to the third region, and read by applying the first voltage to the first region.

The present invention also relates to an array of memory cells each having the foregoing arrangement.

DETAILED DESCRIPTION OF THE PREFERRED EMBODIMENT

Figure 1:
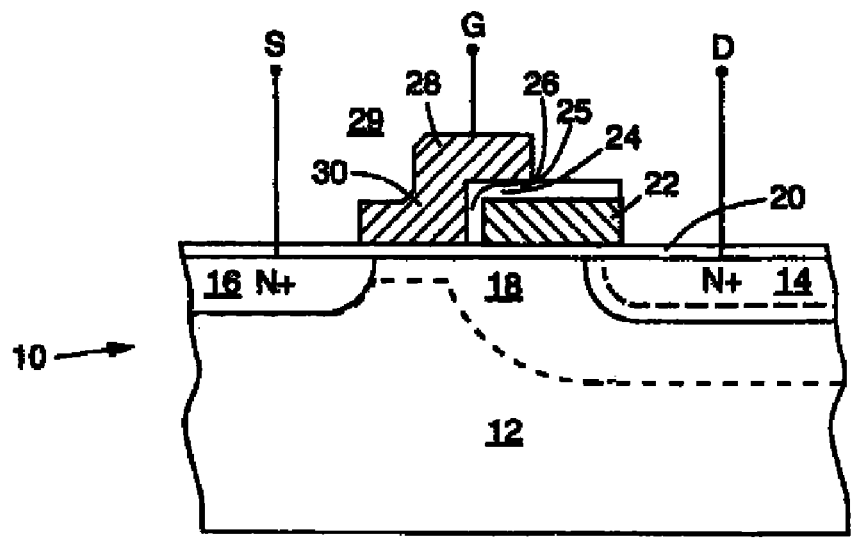
FIG. 1 is a cross section view of a non-volatile storage transistor of the prior art, that can be used in the memory cell and array of the present invention.
Figure 2:
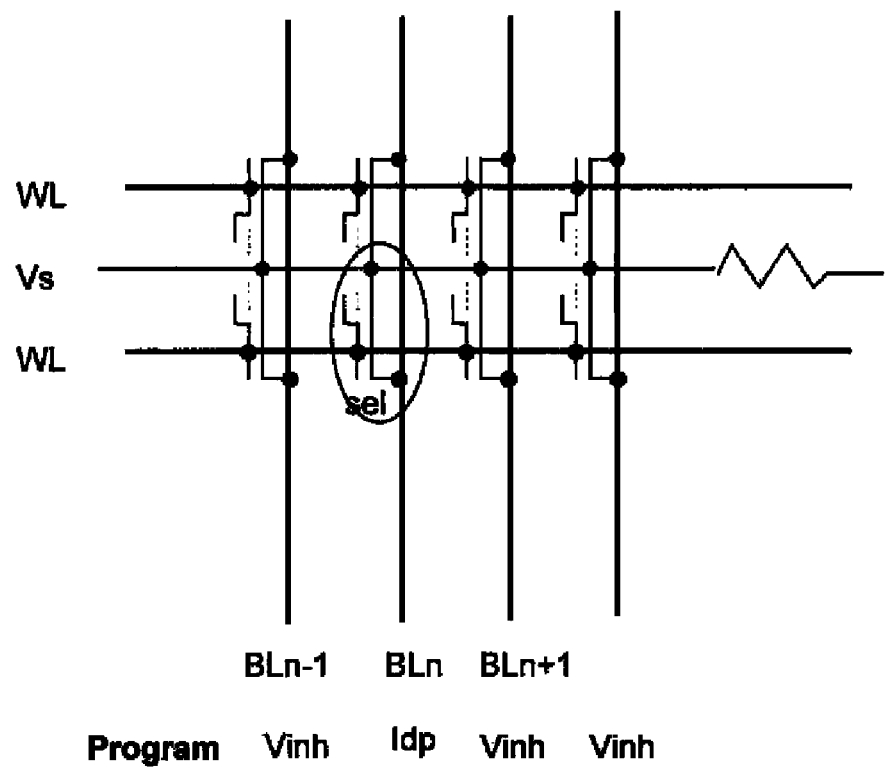
FIG. 2 is a schematic view of an array of storage transistors of the prior art shown in FIG. 1.
Figure 3:
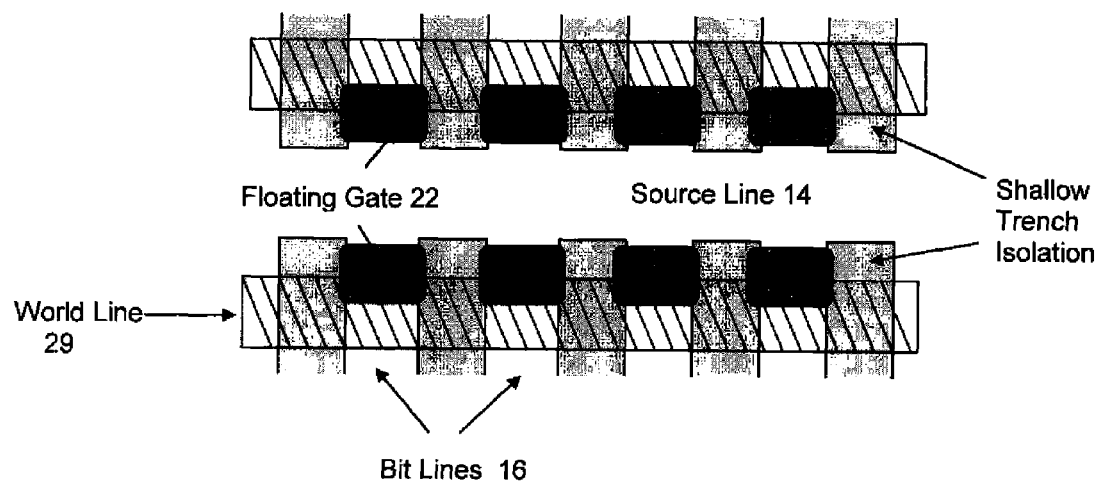
FIG. 3 is a top view of an array of prior art storage transistors of the type shown in FIG. 1.
Figure 4:
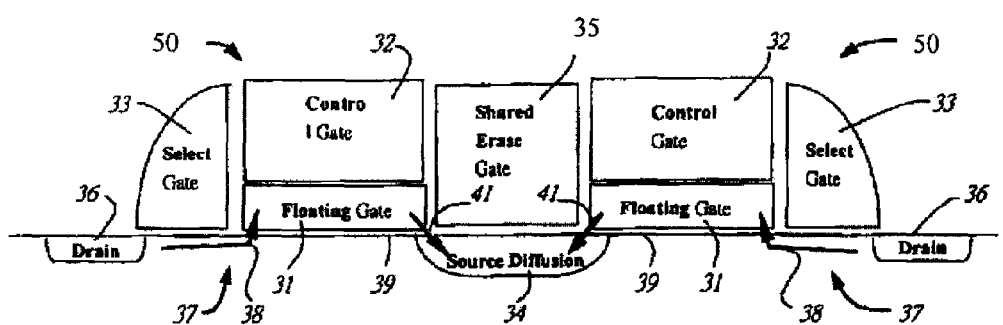
FIG. 4 is a cross section view of another non-volatile storage transistor of the prior art that can be used in the memory cell and array of the present invention.
Figure 5:
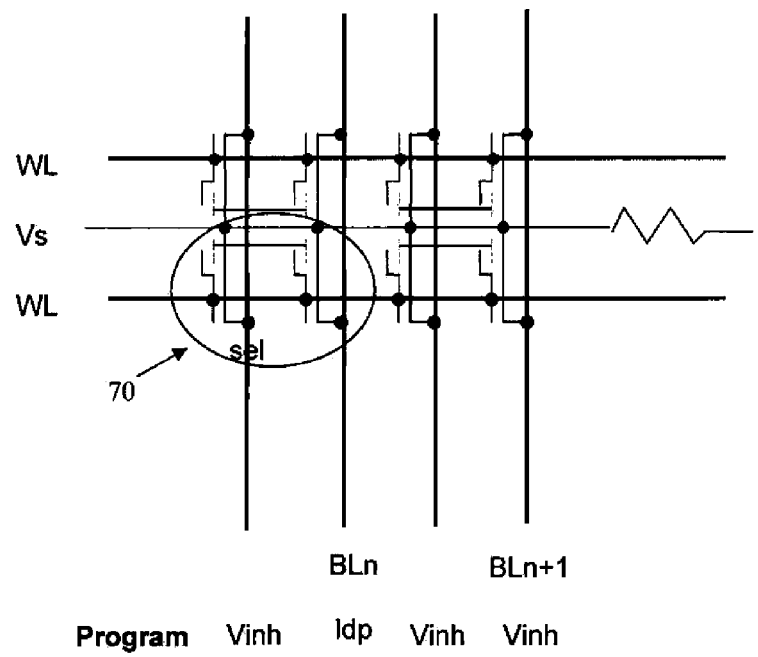
FIG. 5 is a schematic view of an array of memory cells of the present invention.

Referring to FIG. 5 there is a shown a schematic array of memory cells 70 of the present invention. Each memory cell 70 of the present invention comprises two storage transistors of the type 10 or 50 of the prior art as shown in FIGS. 1 and 4, respectively. Hereinafter, the discussion will first be made with respect to a memory cell 70 of the present invention using the storage transistors 10 of the prior art. As discussed hereinabove, each storage transistor 10 has two regions 14 and 16 of the second conductivity type in the substrate 12 with a channel region 18 therebetween extending in a first direction. The two storage transistors 10 of a memory cell 70 of the present invention are positioned adjacent and spaced apart from one another in a second direction, substantially perpendicular to the first direction. The first region 14 of a first storage transistor 10 is connected to the first region 14 of a second storage transistor 10 adjacent thereto by the common source line 14, as done in the prior art. The word line 29 of a first storage transistor 10 extends to connect to the word line 29 of a second storage transistor 10 immediately adjacent thereto, as done in the prior art. However, the floating gate 22 of a first storage transistor 10 extends and connects to the floating gate 22 of a second storage transistor 10 immediately adjacent thereto, thereby forming the memory cell 70, of the present invention. The second region 16 of a first storage transistor 10 is adjacent to the second region 16 of a second storage transistor 10 and is separated therefrom by the shallow isolation trench, as is done in the prior art. Finally, the second region 16 of the first storage transistor 10 is used for read operation while the second region 16 of the second storage transistor 10 is used for programming operation, or vice versa. This is shown in FIG. 5 wherein during programming, a programming current of Idp is applied to the programming terminal of the selected memory cell 70 and the inhibit voltage of Vinh is applied to the other terminal of the selected memory cell 70 as well as to all the terminals of all the other memory cells 70.

Figure 6:
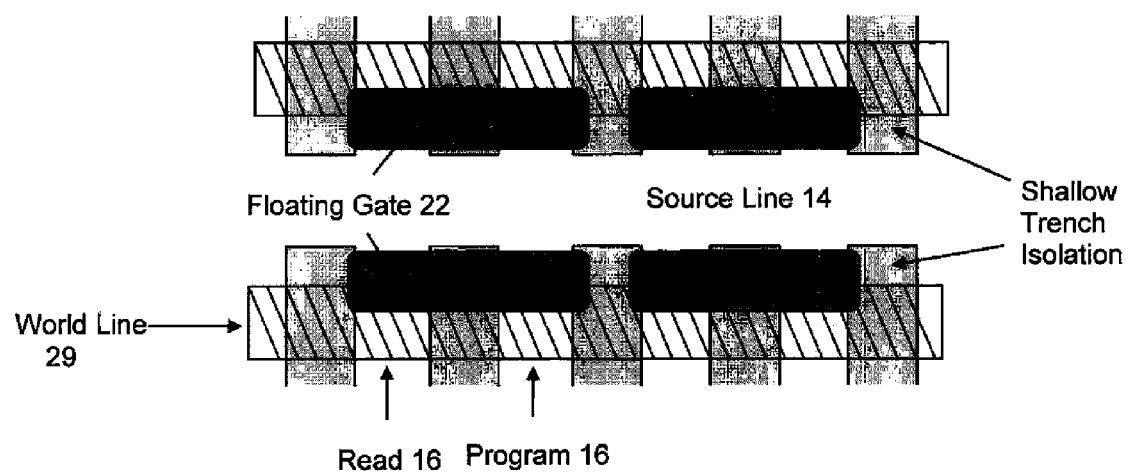
FIG. 6 is a top view of an array of memory cells of the present invention.

A top view of the memory cells 70 of the present invention formed in an array is shown in FIG. 6.

As previously discussed, the memory cell 70 of the present invention may also be constructed of two storage transistors 50 of the type shown in FIG. 4. Similar to the discussion of for the memory cell 70 using a pair of storage transistors 10 of the type shown in FIG. 1, a memory cell 70 using a pair of storage transistors 50 would have the floating gates 31 of the two storage transistors 50 connected together. Further, the source region 34 would be connected in the substrate 12. The select gate 33 would also be connected between storage transistors 50 in the same memory cell 70. The control gates 32 of the storage transistors 50 of the same memory cell 70 are also connected together. Finally, the erase gate 35 of the storage transistors 50 of the same memory cell 70 are also connected together.

The theory of operation of the memory cell 70 is as follows. In the memory cell 70 of the present invention, there are two channel regions forming two current paths: one used during programming, and one used during read. In the event during programming, electrons are trapped at the insulator interface between the floating gate and the substrate in the programming path of the programming channel region, thereby degrading the floating gate transistor transconductance, this has no impact on the channel region in the read current path. Because the floating gate is conductive, whatever electrons are stored on the floating gate during the programming operation still control the channel region that is used for reading. This reading channel would not be impacted by the electrons lodged or trapped at the insulator interface between the floating gate and the substrate in the channel region of the programming path. As a result, the endurance of the memory cell 70 is increased.

What is claimed is:

1. An electrically programmable and erasable memory cell comprising:
    a substrate of semiconductor material of a first conductivity type;
    a first storage transistor of the type having a first region and a second region in said substrate each of a second conductivity type, with the first and second regions spaced apart from one another with a first channel region therebetween, defined in a first direction; a first floating gate over at least a portion of said first channel region, insulated therefrom, to control the conduction of current through the first channel region; a first control gate capacitively coupled to the first floating gate; wherein said first storage transistor is read by applying a first voltage to said first region;
    a second storage transistor of the type having a third region and a fourth region in said substrate each of a second conductivity type, with the third and fourth regions spaced apart from one another with a second channel region therebetween, defined in the first direction; with the second storage transistor adjacent and spaced apart from the first storage transistor in a second direction substantially perpendicular to the first direction, with the third region laterally spaced apart from the first region in the second direction and the fourth region laterally spaced apart from the second region in the second direction; said second storage transistor further comprising a second floating gate over at least a portion of said second channel region, insulated therefrom, to control the conduction of current through the second channel region; a second control gate capacitively coupled to the second floating gate; wherein said second storage transistor is programmed by applying a first current to said third region;
    wherein the first floating gate is electrically connected to the second floating gate;
    wherein the first region is insulated from the third region in the substrate; and
    wherein the memory cell is programmed by applying the first current to the third region, and read by applying the first voltage to the first region.

2. The electrically programmable and erasable memory cell of claim 1, wherein said second region and said fourth region are electrically connected.

3. The electrically programmable and erasable memory cell of claim 2, wherein said second region and said fourth region are electrically connected in the substrate.

4. The electrically programmable and erasable memory cell of claim 3 wherein said first control gate is over at least another portion of said first channel region, insulated therefrom, and said second control gate is over at least another portion of said second channel region, insulated therefrom.

5. The electrically programmable and erasable memory cell of claim 4 wherein said first control gate and second control gate are electrically connected.

6. The electrically programmable and erasable memory cell of claim 5 wherein said first floating gate is over a portion of said second region and is capacitively coupled thereto, and said second floating gate is over a portion of said fourth region and is capacitively coupled thereto.

7. The electrically programmable and erasable memory cell of claim 5 further comprising:
- a first coupling gate over the first control gate and capacitively coupled thereto;
- a second coupling gate over the second control gate and capacitively coupled thereto;
- wherein said first coupling gate is electrically connected to the second coupling gate.

8. The electrically programmable and erasable memory cell of claim 7 further comprising:
- a first erase gate over the second region;
- a second erase gate over the fourth region;
- wherein the first erase gate and second erase gate are electrically connected.

9. An array of electrically programmable and erasable memory cells comprising:
- a substrate of semiconductor material of a first conductivity type;
- a plurality of electrically programmable and erasable memory cells arranged in a plurality of rows and columns in said substrate, with each memory cell comprising:
  - a first storage transistor of the type having a first region and a second region in said substrate each of a second conductivity type, with the first and second regions spaced apart from one another with a first channel region therebetween, defined in a column direction; a first floating gate over at least a portion of said first channel region, insulated therefrom, to control the conduction of current through the first channel region; a first control gate capacitively coupled to the first floating gate; wherein said first storage transistor is read by applying a first voltage to said first region;
  - a second storage transistor of the type having a third region and a fourth region in said substrate each of a second conductivity type, with the third and fourth regions spaced apart from one another with a second channel region therebetween, defined in the column direction; with the second storage transistor adjacent and spaced apart from the first storage transistor in a row direction substantially perpendicular to the column direction, with the third region laterally spaced apart from the first region in the row direction and the fourth region laterally spaced apart from the second region in the row direction; said second storage transistor further comprising a second floating gate over at least a portion of said second channel region, insulated therefrom, to control the conduction of current through the second channel region; a second control gate capacitively coupled to the second floating gate; wherein said second storage transistor is programmed by applying a first current, to said third region;
- wherein the first floating gate is electrically connected to the second floating gate;
- wherein the first region is insulated from the third region in the substrate;
- wherein the memory cell is programmed by applying the first current to the third region, and read by applying the first voltage to the first region;
- a plurality of word lines extending in the row direction, with each word line electrically connected to the first control gate and the second control gate of each memory cell in the same row direction;
- a plurality of source lines extending in the row direction, with each source line electrically connected to the second region and the fourth region of each memory cell in the same row direction;
- a plurality of read lines extending in the column direction with each read line electrically connected to the first region of each memory cell in the same column direction; and
- a plurality of program lines extending in the column direction with each program line electrically connected to the third region of each memory cell in the same column direction.

10. The array of claim 9, wherein each of said source lines extends in the row direction and electrically connects to the second region and the fourth region of each memory cell in the same row direction in the substrate.

11. The array of claim 10 wherein said first control gate is over at least another portion of said first channel region, insulated therefrom, and said second control gate is over at least another portion of said second channel region, insulated therefrom of each memory cell.

12. The array of claim 11 wherein said first floating gate is over a portion of said second region and is capacitively coupled thereto, and said second floating gate is over a portion of said fourth region and is capacitively coupled thereto, of each memory cell.

13. The array of claim 12 further comprising:
- a first coupling gate over the first control gate and capacitively coupled thereto, and a second coupling gate over the second control gate and capacitively coupled thereto of each memory cell;
- wherein said first coupling gate is electrically connected to the second coupling gate of each memory cell.

14. The array of claim 13 further comprising a plurality of coupling lines extending in the row direction, with each coupling line electrically connected to the first coupling gate and the second coupling gate of each memory cell in the same row direction.

15. The array of claim 14 further comprising:
- a first erase gate over the second region, and a second erase gate over the fourth region of each memory cell;
- wherein the first erase gate and second erase gate of each memory cell are electrically connected.

16. The array of claim 15 further comprising a plurality of erase lines extending in the row direction, with each erase line electrically connected to the first erase gate and the second erase gate of each memory cell in the same row direction.

17. A non-volatile memory cell comprises:
- a semiconductor substrate of a first conductivity type;
- a first terminal, a second terminal and a third terminal of a second conductivity type are formed in the substrate, with a first channel region between the first terminal and the third terminal, and a second channel region between the second terminal and the third terminal;
- a floating gate extending over the first channel region and the second channel region and controlling the conduction of current in the first channel region and the second channel region;
- a control gate extending over the first channel region and the second channel region and controlling the conduction of the current in the first channel region and the second channel region;
- wherein said memory cell is programmed by current conduction in the first channel region, and said memory cell is read by current conduction in the second channel region.

* * * * *